United States Patent [19]

Faugeron

[11] Patent Number: 4,607,390
[45] Date of Patent: Aug. 19, 1986

[54] SQUELCH ARRANGEMENT FOR AM/FM RADIO RECEIVER

[75] Inventor: Gabriel Faugeron, Nazareth Par Meyssac, France

[73] Assignee: U.S. Philips Corporation, New York, N.Y.

[21] Appl. No.: 615,963

[22] Filed: May 31, 1984

[30] Foreign Application Priority Data

Jun. 1, 1983 [FR] France ................ 83 09073

[51] Int. Cl.$^4$ ............................................. H04B 1/10
[52] U.S. Cl. ..................................... 455/143; 455/212; 455/222; 455/312
[58] Field of Search ................ 455/140, 142–144, 455/194, 212, 218, 222, 221, 223, 224, 225, 312

[56] References Cited

U.S. PATENT DOCUMENTS

| 3,728,634 | 4/1973 | Watkinson | 455/143 |
| 3,745,467 | 7/1973 | Lundquist et al. | 455/143 |
| 3,875,514 | 4/1975 | Klein | 455/143 |
| 3,919,645 | 11/1975 | Ohsawa et al. | 455/143 |
| 4,304,004 | 12/1981 | Von Der Neyen | 455/143 |

FOREIGN PATENT DOCUMENTS

| 1282746 | 7/1969 | Fed. Rep. of Germany . |
| 27535 | 3/1981 | Japan ................ 455/218 |

Primary Examiner—Jin F. Ng
Attorney, Agent, or Firm—Thomas A. Briody; William J. Streeter; Marianne R. Rich

[57] ABSTRACT

A radio receiver has an IF amplifier whose output is connected to an AM demodulator and an FM demodulator. The noise level at the output of the FM demodulator is measured and, when it exceeds a predetermined threshold level, the audio output stage of the receiver is disconnected from the circuit. Noise generated when amplitude modulated signals with a high degree of modulation are received may cause unwanted disconnection of the output circuit. This is prevented by a circuit connected to the output of the AM demodulator which detects negative peaks of the modulation signal which exceed a negative threshold. The integrated peak signals form a correction signal which prevents disconnection of the output stage.

3 Claims, 2 Drawing Figures

SQUELCH ARRANGEMENT FOR AM/FM RADIO RECEIVER

BACKGROUND OF THE INVENTION

1. Field of the Invention

The invention relates to a squelch arrangement for receivers comprising an AM demodulator and an FM demodulator for amplitude-modulation or frequency-modulation operation of the receiver respectively, this squelch arrangement comprising a noise level measuring circuit connected to the output of the FM demodulator for supplying a noise signal when the receiver operates in the amplitude-modulation mode or in the frequency-modulation mode, this noise level signal being applied to a comparison circuit which activates an interrupter circuit for cutting-off the audio-frequency signal recovered by the receiver when the noise level exceeds a certain threshold.

2. Description of the Prior Art

It is known that in the absence of a signal at their inputs, radio receivers produce at their outputs a noise which is very annoying especially for monitors continuously tuned to a certain carrier frequency. The squelch arrangements have for their object to mute the audio-frequency output signal of the receiver when no modulation signal is received and to restore it when a modulation signal appears again.

Some types of squelch arrangements used in frequency-modulation receivers are based on measuring the noise level at the output of the frequency demodulator of the receiver, in a frequency band located outside the frequency band used for the modulation signal. The known squelch arrangement, considered above for a receiver capable of operating in the frequency-modulation or the amplitude-modulation mode, is based on the measurement of the noise level at the output of the frequency demodulator of the receiver, whether the receiver operates in the frequency-modulation or the amplitude-modulation mode. But it has been found that when the receiver receives an amplitude-modulated signal there is certain sensitivity of the squelch arrangement to the modulation depth, which causes an increase in the noise produced by the frequency demodulator when the modulation depth exceeds a certain value resulting in an unwanted muting of the audio signal.

SUMMARY OF THE INVENTION

The present invention has for its object to provide a squelch arrangement which does not have this disadvantage.

According to the invention, a correction circuit being operative when the receiver functions in the amplitude-modulation mode is coupled between the output of the AM demodulator and the squelch arrangement, this correction circuit comprising a detection circuit for detecting peaks of a certain polarity of the modulation signal exceeding a certain threshold, which circuit is connected to an integrating circuit for supplying a correction signal which is applied to said comparison circuit in such manner as to produce there an effect opposite to the effect of the said noise level signal.

It is known, more specifically, from the German Patent Application No. 1 282 746 to derive a correction signal from the average amplitude of the intermediate-frequency carrier, that is to say the average field strength of the received signal. However, this correction circuit is independent of the modulation depth. Moreover, the threshold of the prior art squelch arrangement is reduced when the average amplitude of said carrier is small while the threshold of the squelch arrangement according to the invention is increased when the last mentioned peaks of the modulation signal occur.

The following description given by way of example with reference to the accompanying drawings will make it better understood how the invention can be put into effect.

BRIEF DESCRIPTION OF THE DRAWING

In FIG. 1, which shows the squelch arrangement according to the invention, reference numeral 1 denotes the amplitude demodulator (designated AM demodulator hereafter) and reference numeral 2 denotes the frequency demodulator (FM demodulator), these two demodulators being incorporated in a receiver which can operate in the frequency-modulation or the amplitude-modulation mode. The intermediate-frequency (IF) signal formed in the receiver is applied to an IF-signal amplifier 3 incorporated in AM demodulator 1. The amplified IF-signal is processed in a manner known per se in demodulator AM 1, which supplies at its output 4 a signal $S_a$ which is the useful audio-frequency signal when the receiver receives an amplitude-modulated signal. The demodulator 1 also supplies at its output 5 an AGC signal for automatically controlling the gain of the IF-amplifier 3, in such manner that the amplitude of the amplified IF-signal is substantially constant. The amplified IF-signal is also processed in the FM demodulator 2 which supplies at its output 6 a signal $S_f$ which is the useful audio-frequency signal when the receiver receives a frequency-modulated signal.

Figure 1:
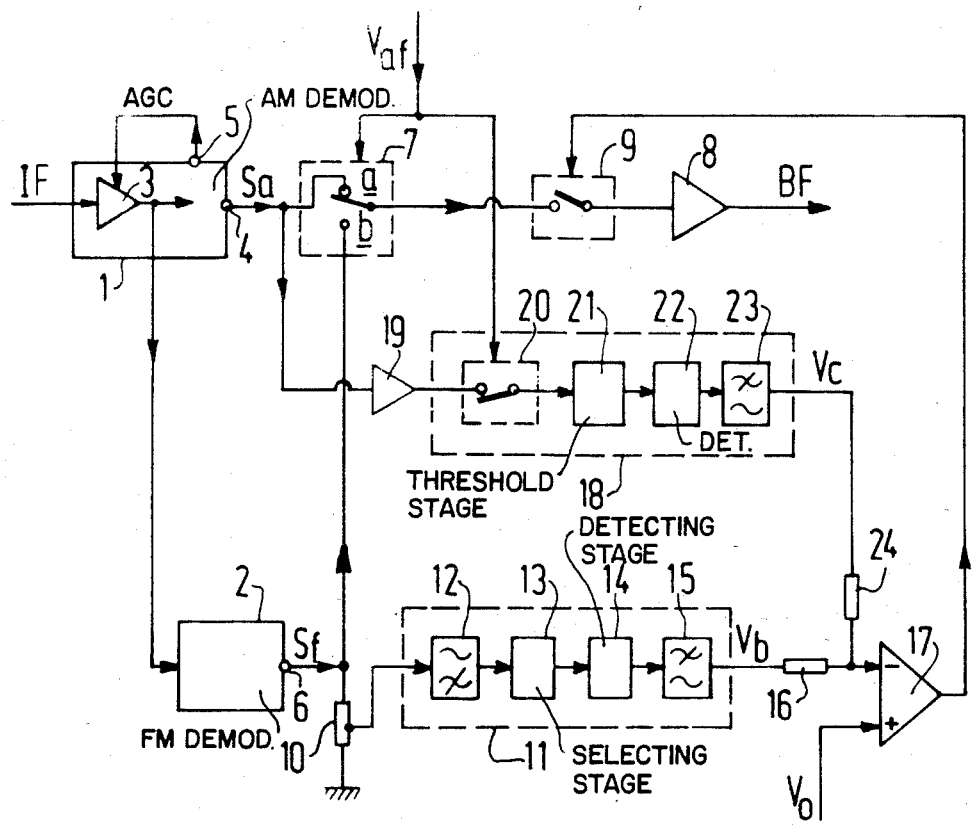
FIG. 1 shows a circuit diagram of the squelch arrangement according to the invention.

A change-over circuit 7 is controlled by the opating mode selection signal $V_{af}$ of the receiver and set to the position a or to the position b in dependence on whether the operating mode choosen is the amplitude-modulation or the frequency-modulation mode, respectively. So the change-over circuit 7 supplies the demodulated audio-frequency signal $S_a$ or $S_f$ to the amplifier 8 which produces the output signal BF of the receiver.

When no signal is received at the input of the receiver, the demodulators 1 and 2 generate high-level noise signal 5 which, when transmitted to the output of the receiver, are very annoying to the operator. The squelch arrangement comprises an interrupter circuit 9 which is controlled to mute the receiver when no signal is present at the input of the receiver.

In the type of squelch arrangement to which the invention relates the interrupter circuit 9 is controlled dependent on the noise level at the output of the FM demodulator 2, this noise level being high when there is no signal at the input of the receiver or for low levels of the useful signal. To measure this noise level a potentiometer 10 is used for taking off a portion of the signal at the output 6 of the FM demodulator 2. This signal portion is processed in a circuit 11 which has at its input a filter 12 of, for example, a high-pass filter type for selecting frequencies outside the band of the useful signal (e.g. 300–3400 Hz). The pulses of the filtered signals are selected and detected in circuits 13 an 14 and finally integrated in low-pass filter 15. This low-pass filter 15 supplies a d.c. voltage $V_b$ which is applied to a terminal of a resistor 16 whose other terminal is connected to the inverting input of a comparator circuit 17. This comparator circuit 17 receivers a constant voltage $V_o$ at its non-inverting input. When the d.c. voltage $V_b$ which is representative of the noise level at the output of the demodulator 2 exceeds a threshold voltage determined by the voltage $V_o$, the logic circuit which is adjusted by the comparator circuit 17 changes its value in such manner that the interrupter circuit is opened, as a result of which the audio-frequency circuit of the receiver is muted, the opposite action taking place when the voltage $V_b$ falls again to below the said threshold voltage.

But, as described in the foregoing, this squelch arrangement may operate incorrectly when the receiver receives an amplitude-modulated signal having a high modulation depth factor of at least approximately 50%. In this condition, in the "dips" of the modulated signal for which the instantaneous level of the IF-signal falls below the threshold of the limiter of the FM demodulator 2, this FM demodulator 2 generates a certain noise which, after having been processed in the circuit 11, may have a value high enough to effect unwanted muting of the audio-frequency circuit of the receiver.

To obviate this disadvantage, the squelch arrangement is provided, in accordance with the invention, with a correction circuit 18 which produces a correction signal $V_c$ capable of adequately correcting the noise level signal $V_b$.

The correction circuit 18 is connected to the output of an amplifier 19 which amplifies the output signal of AM demodulator 1, this output signal being the modulation signal when the carrier is amplitude-modulated. The correction circuit 18 comprises an interrupter circuit 20 which is controlled by the selection signal $V_{af}$ in such manner as to convey the output signal of the amplifier 19 to a threshold circuit 21, only when the receiver operates in the amplitude-modulation mode. The threshold circuit 21 cooperates with a detection circuit 22 for detecting the negative peaks of the modulation signal supplied by the amplifier 19 which exceed a negative threshold. When the receiver receives an amplitude-modulated carrier, the negative pulses thus formed are produced during the negative peaks of the modulation signal which exceed a negative threshold, that is to say during the dips of the modulated signal, above a certain modulation factor corresponding to said threshold. The negative pulses produced by the detector 22 are integrated with the aid of the low-pass filter 23, which supplies the correction voltage $V_c$. This correction voltage $V_c$ is applied to a terminal of the resistor 24 whose other terminal is connected to the inverting input of the comparator circuit 17.

The correction voltage $V_c$ corrects the effect of the noise level voltage $V_b$ in a sense tending to decrease the difference between the voltage applied to the inverting input of the comparator circuit 17 and the fixed voltage $V_o$ applied to the non-inverting input. This correction voltage is only present when the receiver operates in the amplitude-modulation mode and when the modulation depth exceeds a threshold value determined by the threshold circuit 21. It is thus possible to avoid unwanted triggering of the squelch arrangement.

Figure 2:
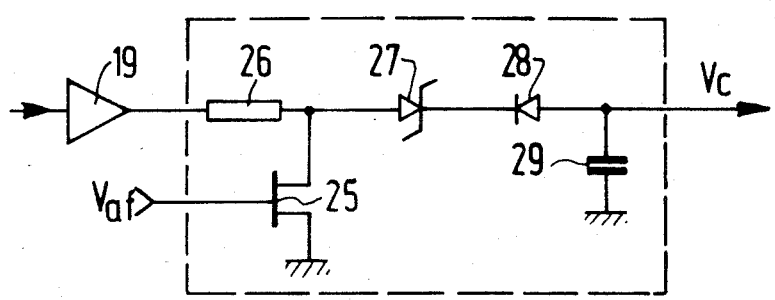
FIG. 2 shows an embodiment of the correction circuit incorporated in this squelch arrangement.

FIG. 2 illustrates a simple embodiment of the correction circuit 18. This circuit 18 has at its input a transistor 25 of the J.FET channel P type whose gate is controlled directly by the selection voltage $V_{af}$ renders it is possible to short-circuit the modulation voltage supplied by the amplifier 19 via the isolating resistor 26. When the receiver is adjusted to the amplitude-modulation mode, the modulation voltage is applied to a zener diode 27 which is arranged in series with and cathode-connected to a diode 28. This arrangement 27, 28 is equivalent to a diode having the threshold voltage $V_Z$ of the zener diode 27 and thus supplies negative peaks exceeding the negative threshold $-V_Z$. These negative peaks are integrated with the aid of the capacitor 29, one electrode of which is connected to ground and whose other electrode, which is connected to the diode 28, supplies the correction voltage $V_c$.

What is claimed is:

1. In a radio receiver having IF amplifier means, AM demodulator means and FM demodulator means connected to said IF amplifier means, a receiver output stage selectively connectable to said AM demodulator means or said FM demodulator means, and muting circuit means coupled to said FM demodulation means and responsive to noise signals received therefrom for disconnecting said receiver output stage from said AM or said FM demodulator means when said noise signals exceed a predetermined threshold level, the improvement comprising correction circuit means connected to said AM demodulator means for generating a correction signal in response to AM demodulator output signals indicative of AM modulation exceeding a predetermined modulation degree; and means for applying said correction signal to said muting circuit means to prevent said disconnection of said receiver output stage, whereby said muting circuit means is inactivated when said noise level at said output of said FM demodulator means is created by high degrees of modulation of a received AM signal.

2. A radio receiver as claimed in claim 1, wherein said muting circuit means comprises means for furnishing a reference signal, comparator means for comparing said noise signals to said reference signal and generating a disconnect signal when said noise signals exceeds said reference signal, and switch means responsive to said disconnect signal for disconnecting said output stage from said AM or said FM demodulator means.

3. A radio receiver as claimed in claim 2, further comprising means for furnishing an operating mode selection signal signifying desired AM or FM operation; and wherein said correction circuit means comprises threshold circuit means furnishing a threshold output signal when a negative signal applied thereto exceeds a predetermined negative threshold level, interrupter circuit means interconnected between said AM demodulator means and said threshold means for connecting said AM demodulator means to said threshold means only when said receiver is in said AM mode, and integrator means integrating said threshold output signal to provide said correction signal.

* * * * *